US008621317B1

(12) United States Patent
Cypher

(10) Patent No.: US 8,621,317 B1
(45) Date of Patent: Dec. 31, 2013

(54) MODIFIED ORTHOGONAL CODING TECHNIQUES FOR STORING DATA

(75) Inventor: Robert Cypher, Saratoga, CA (US)

(73) Assignee: Google Inc., Mountain View, CA (US)

( * ) Notice: Subject to any disclaimer, the term of this patent is extended or adjusted under 35 U.S.C. 154(b) by 181 days.

(21) Appl. No.: 13/190,151

(22) Filed: Jul. 25, 2011

(51) Int. Cl.
*H03M 13/00* (2006.01)

(52) U.S. Cl.
USPC .......................................................... 714/755

(58) Field of Classification Search
USPC .................................. 714/755, 763, 769, 784
See application file for complete search history.

(56) References Cited

U.S. PATENT DOCUMENTS

| | | | |
|---|---|---|---|
| 6,032,269 A | 2/2000 | Renner | |
| 6,151,641 A | 11/2000 | Herbert | |
| 6,216,247 B1 | 4/2001 | Creta et al. | |
| 6,378,038 B1 | 4/2002 | Richardson et al. | |
| 6,721,317 B2 | 4/2004 | Chong | |
| 7,299,401 B2 * | 11/2007 | Fukuda | 714/769 |
| 7,356,752 B2 | 4/2008 | Hewitt et al. | |
| 7,398,459 B2 | 7/2008 | Park et al. | |
| 7,505,890 B2 | 3/2009 | Kuznetsov et al. | |
| 7,546,484 B2 | 6/2009 | Sen et al. | |
| 7,617,439 B2 * | 11/2009 | Shen et al. | 714/784 |
| 7,624,229 B1 | 11/2009 | Longinov | |
| 7,676,730 B2 | 3/2010 | Haugan et al. | |
| 7,739,446 B2 | 6/2010 | Kano | |
| 7,774,681 B2 | 8/2010 | Earhart et al. | |
| 7,831,764 B2 | 11/2010 | Nakajima et al. | |
| 7,831,895 B2 * | 11/2010 | Lin | 714/800 |
| 7,861,035 B2 | 12/2010 | Baek et al. | |
| 7,861,052 B2 | 12/2010 | Kawamura et al. | |
| 8,065,555 B2 | 11/2011 | Maiyuran et al. | |
| 8,082,393 B2 | 12/2011 | Galloway et al. | |
| 8,086,783 B2 | 12/2011 | O'Connor et al. | |
| 8,090,792 B2 | 1/2012 | Dubnicki et al. | |
| 8,140,753 B2 | 3/2012 | Galloway et al. | |
| 8,145,865 B1 | 3/2012 | Longinov et al. | |
| 8,176,247 B2 | 5/2012 | Galloway et al. | |
| 8,180,954 B2 | 5/2012 | Kilzer et al. | |
| 8,213,205 B2 | 7/2012 | Rajan | |
| 8,234,539 B2 | 7/2012 | Erez | |
| 8,255,761 B1 | 8/2012 | Pi et al. | |

(Continued)

OTHER PUBLICATIONS

Wikipedia; Reed Solomon; http://en.wikipedia.org/wiki/Reed_Solomon; 14 pages.

(Continued)

*Primary Examiner* — Shelly A Chase
(74) *Attorney, Agent, or Firm* — Fish & Richardson P.C.

(57) ABSTRACT

Methods, systems, and apparatus, including computer programs encoded on a computer storage medium, for modified orthogonal coding techniques. In one aspect, a method includes receiving a block of data. A column of error-correcting row code chunks is generated using a matrix of row weights that includes weights [a b c d], wherein a and b are in a same first row and c and d are in a same second row, and wherein a and c are in a same first column and b and d are in a same second column. A row of error-correcting column code chunks is generated using a matrix of column weights that includes weights [e f g h] at positions corresponding to respective positions of [a b c d] in the matrix of row weights, wherein $$\frac{ad}{bc} \neq \frac{eh}{fg}.$$

27 Claims, 6 Drawing Sheets

(56) References Cited

U.S. PATENT DOCUMENTS

| | | |
|---|---|---|
| 8,279,755 B2 | 10/2012 | Luby |
| 8,307,258 B2 | 11/2012 | Flynn et al. |
| 8,327,234 B2 | 12/2012 | Earnshaw et al. |
| 8,327,237 B2 | 12/2012 | Buckley et al. |
| 8,335,966 B1 * | 12/2012 | Lary et al. .............. 714/770 |
| 2003/0056068 A1 | 3/2003 | McAllister et al. |
| 2003/0149750 A1 | 8/2003 | Franzenburg |
| 2005/0091234 A1 | 4/2005 | Hsu et al. |
| 2006/0080505 A1 | 4/2006 | Arai et al. |
| 2009/0262839 A1 | 10/2009 | Shelby et al. |
| 2009/0265578 A1 | 10/2009 | Baloun et al. |
| 2010/0037117 A1 | 2/2010 | Pescatore |
| 2011/0258161 A1 | 10/2011 | Constantinescu et al. |
| 2012/0036333 A1 | 2/2012 | Lecrone et al. |
| 2012/0042142 A1 | 2/2012 | Garman et al. |
| 2012/0042200 A1 | 2/2012 | Takeuchi et al. |
| 2012/0042201 A1 | 2/2012 | Resnick |
| 2012/0131383 A1 | 5/2012 | Galloway et al. |

OTHER PUBLICATIONS

Hafner, James; "HoVer Erasure Codes for Disk Arrays;" Proceedings of the 2006 International Conference on Dependable Systems and Networks; pp. 217-226; 2006; 10 pages.

Li, Mingqiang; "GRID Codes: Strip-Based Erasure Codes with High Fault Tolerance for Storage Systems;" ACM Transactions on Storage, vol. 4, No. 4, Article 15, Jan. 2009; 22 pages.

Duminuco, Alessandro; "Hierarchical Codes: How to Make Erasure Codes Attractive for Peer-to-Peer Storage Systems;" Proceedings of the Eighth International Conference on Peer-to-Peer Computing; 2008 (P2P'08), pp. 8-11; 10 pages.

* cited by examiner

|   | 202 | 204 | 206 | 208 | 210 |
|---|---|---|---|---|---|
| 212 | D0 | D4 | D8 | D12 | C4 |
| 214 | D1 | D5 | D9 | D13 | C5 |
| 216 | D2 | D6 | D10 | D14 | C6 |
| 218 | D3 | D7 | D11 | D15 | C7 |
| 220 | C0 | C1 | C2 | C3 | C8 |

FIG. 2A  ↳200

|   | 202 | 204 | 206 | 208 | 210 |
|---|---|---|---|---|---|
| 212 | D0 | D4 | D8 | D12 | C4 |
| 214 | D1 | X | D9 | X | C5 |
| 216 | D2 | D6 | D10 | D14 | C6 |
| 218 | D3 | X | D11 | X | C7 |
| 220 | C0 | C1 | C2 | C3 | C8 |

FIG. 2B  ↳200

|   | 202 | 204 | 206 | 208 | 210 |
|---|---|---|---|---|---|
| 212 |   |   |   |   |   |
| 214 |   | a |   | b |   |
| 216 |   |   |   |   |   |
| 218 |   | c |   | d |   |
| 220 |   |   |   |   |   |

FIG. 2C  ↳250

|   | 202 | 204 | 206 | 208 | 210 |
|---|---|---|---|---|---|
| 212 |   |   |   |   |   |
| 214 |   | e |   | f |   |
| 216 |   |   |   |   |   |
| 218 |   | g |   | h |   |
| 220 |   |   |   |   |   |

FIG. 2D  ↳260

MODIFIED ORTHOGONAL CODING TECHNIQUES FOR STORING DATA

BACKGROUND

This specification relates to digital data processing and, in particular, data storage, access, and maintenance.

Important data is conventionally stored on storage devices that potentially fail. The data can be backed-up and stored redundantly so that the data can be recovered if a storage device fails. Conventional data centers can store large amounts of data. Some data is stored redundantly across multiple data centers so that even if an entire data center fails the data can be recovered.

Data can be stored using error-detecting codes. An error-detecting code adds extra data to the data that enables detection of certain errors in the data. One example of an error-detecting code is a cyclic redundancy check (CRC). CRC codes are used to detect failures on storage devices (e.g., hard disk drives).

Data can also be stored using error-correcting codes. An error-correcting code adds extra data to the data that enables correction of errors in the data. The number of errors that can be corrected is limited by the amount of extra data that is added. Examples of error-correcting codes include Reed-Solomon codes.

SUMMARY

An encoding system stores data using a modified orthogonal code. Using a conventional orthogonal code with a single column of row code chunks and a single row of column code chunks, the smallest set of damaged chunks that cannot be reconstructed (typically the most common set that cannot be reconstructed) is a set of four damaged chunks in a rectangle. Using the modified orthogonal code with a single column of row code chunks and a single row of column code chunks, the set of four damaged chunks in a rectangle can be reconstructed. The modified orthogonal code is created by selecting weights for a matrix of row weights, column weights, or both so that the matrix is nonsingular.

In general, one innovative aspect of the subject matter described in this specification can be embodied in methods that include the actions of receiving a block of data comprising m rows and n columns of data chunks; generating a column of error-correcting row code chunks including multiplying data chunks in the block of data by row weights in a matrix of row weights that includes weights [a b c d], wherein a and b are in a same first row and c and d are in a same second row, and wherein a and c are in a same first column and b and d are in a same second column; generating a row of error-correcting column code chunks including multiplying data chunks in the block of data by column weights in a matrix of column weights that includes weights [e f g h] at positions corresponding to respective positions of [a b c d] in the matrix of row weights, wherein $$\frac{ad}{bc} \neq \frac{eh}{fg};$$

and storing the block of data and the column of row code chunks and the row of column code chunks. Other embodiments of this aspect include corresponding systems, apparatus, and computer programs, configured to perform the actions of the methods, encoded on computer storage devices.

A system of one or more computers can be configured to perform particular actions by virtue of having software, firmware, hardware, or a combination of them installed on the system that in operation causes or cause the system to perform the actions. One or more computer programs can be configured to perform particular actions by virtue of including instructions that, when executed by data processing apparatus, cause the apparatus to perform the actions.

These and other embodiments can each optionally include one or more of the following features. The matrix of row weights and the matrix of column weights is selected so that: $e=f=g=h=1$, and $ad \neq bc$; or $a=b=c=d=1$, and $eh \neq fg$. The matrix of row weights or the matrix of column weights forms a Cauchy matrix. The matrix of row weights or the matrix of column weights forms a matrix A, wherein $G=[I|A]$ and I is an identity matrix and G is a generator matrix for a maximum distance separable (MDS) code. At least one of the matrix of row weights or the matrix of column weights is assigned random weights. Assigning the random weights comprises: generating random candidate weights; determining whether the random candidate weights form a singular matrix; and continuing to generate different random candidate weights until determining random candidate weights that form a non-singular matrix. Generating the column of error-correcting row code chunks includes generating a corner code chunk based on the row code chunks and an extra corner code chunk based on the column code chunks. Generating the row of error-correcting column code chunks includes generating a corner code chunk based on the column code chunks and an extra corner code chunk based on the row code chunks. Storing the block of data and the column of row code chunks and the row of column code chunks comprises: for each column in the block of data and the column of row code chunks, storing each particular column and a corresponding column code chunk at a distinct group of storage nodes. The actions further include identifying four damaged chunks at positions corresponding to the positions of [a b c d] and [e f g h]; retrieving a plurality of healthy chunks from the first and second rows and the first and second columns; and reconstructing the four damaged chunks using [a b c d] and [e f g h] and the retrieved healthy chunks.

Particular embodiments of the subject matter described in this specification can be implemented so as to realize one or more of the following advantages. Data can be stored, accessed, and maintained at one or more storage nodes with increased reliability. In particular, certain sets of damaged chunks of data that cannot be reconstructed with conventional orthogonal coding can be reconstructed. The reliability of the stored data can be increased without increasing the amount of data stored, or with only a small increase in the amount of data stored (e.g., for a corner code chunk). In some implementations, maintaining data requires fewer storage accesses (e.g., hard drive reads), which can decrease the number of disks required, and thus the cost of the storage system.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

FIG. 2A is an illustration of an example block of data and code chunks.

FIG. 2B illustrates an example scenario where multiple chunks of data from the block are damaged.

FIG. 2C is an illustration of an example matrix of row weights for generating row code chunks.

FIG. 2D is an illustration of an example matrix of column weights for generating column code chunks.

Like reference numbers and designations in the various drawings indicate like elements.

DETAILED DESCRIPTION

Figure 1:
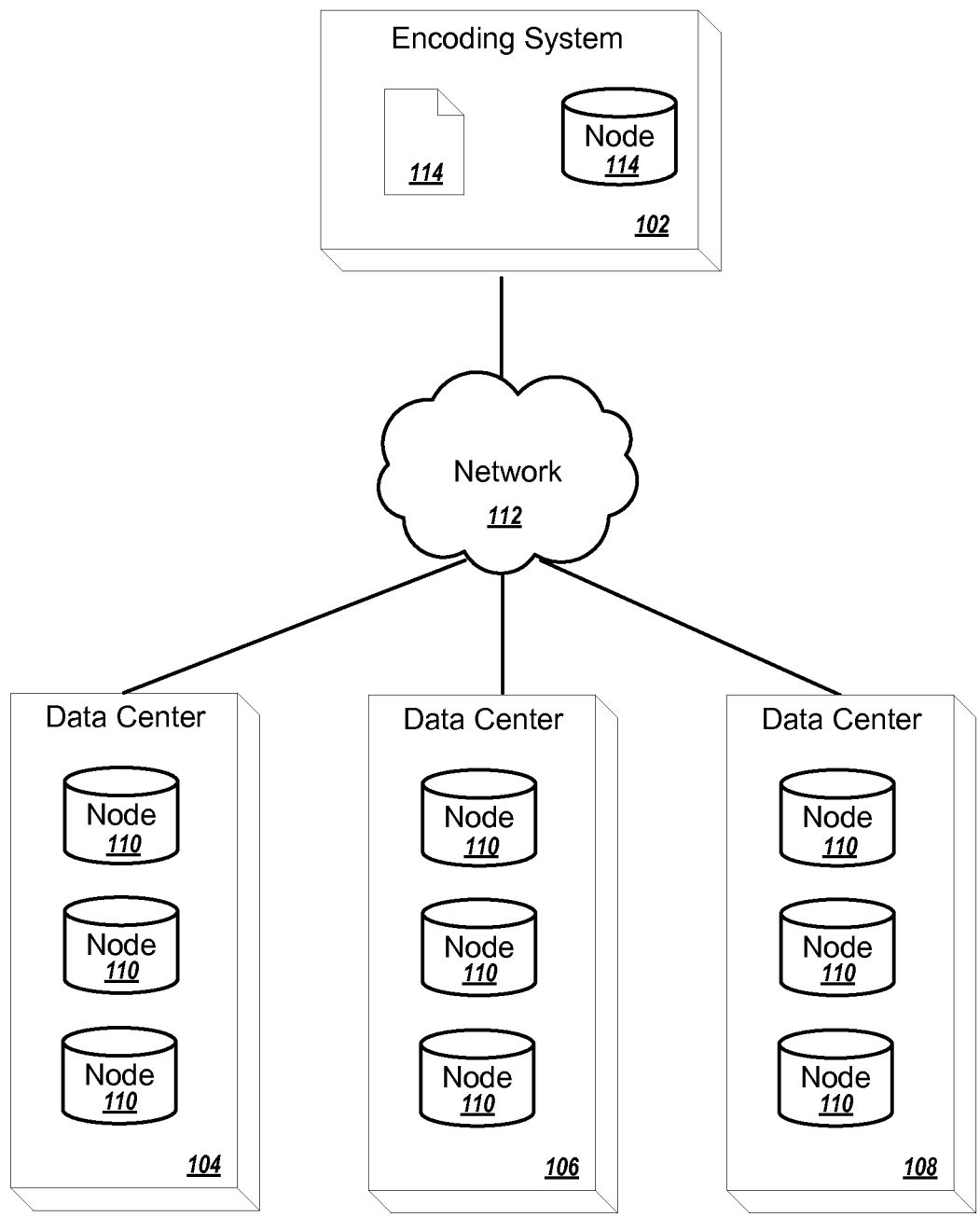
FIG. 1 is a schematic diagram of an example encoding system configured to store data using modified orthogonal coding techniques to generate error-correcting code chunks.

FIG. 1 is a schematic diagram of an example encoding system 102 configured to store data using modified orthogonal coding techniques to generate error-correcting code chunks.

The encoding system 102 comprises one or more data processing apparatus. The encoding system 102 can store data chunks from a file 114 data at, for example, one or more local storage nodes 114, across storage nodes 110 at data centers 104, 106, and 108, or both. The encoding system 102 can also store redundant copies of data chunks and error-correcting code chunks. The encoding system communicates with the data centers 104, 106, and 108 using a network 112.

A storage node includes one or more computer storage mediums. In some implementations, a storage node is a data server, for example, a server including a data processing apparatus and multiple hard disk drives on which data can be stored. A group of storage nodes can include a rack, a sub-network, a data center, or various other collections of servers or storage nodes.

A data center is a group of storage nodes. Typically, a data center is a facility with physical space for computer systems. Data centers can include, for example, telecommunication systems, backup power supplies, climate controls, security. In FIG. 1, the data centers 104, 106, and 108 are shown with three storage nodes; however, each data center can have more or fewer storage nodes.

An orthogonal code is formed including combining two linear systematic maximum distance separable (MDS) codes. A block of data is viewed as forming a two-dimensional matrix of m×n chunks. One MDS code is used to generate error-correcting row code chunks for each row while the other MDS code is used to generate error-correcting column code chunks for each column, e.g., including any columns of row code chunks. In some implementations, the encoding system 102 generates both the row code chunks and the column code chunks (e.g., storing all the data at a local storage node 114, or then sending the code chunks with the data chunks for the data centers 104, 106, and 108). In some implementations, the encoding system 102 generates the row code chunks and then allocates each column of chunks to a distinct group of storage nodes, and each group of storage nodes generates column code chunks for its allocated column of chunks.

When a chunk is identified as being damaged (e.g., using an error-detecting code within each chunk), both the row code chunks and the column code chunks can be used to reconstruct the damaged chunk. For example, if each row has N1 row code chunks and each column has N2 column code chunks, then any row with N1 or fewer errors can be reconstructed and any column with N2 or fewer errors can be reconstructed. In some cases, it may be possible to alternate using the row code chunks and the column code chunks for reconstruction until all of the damaged chunks are reconstructed, even if initially some row has more than N1 damaged chunks, or some column has more than N2 damaged chunks, or both.

In general, the encoding system 102 can use the orthogonal code to reconstruct any set of damaged chunks as long as the damaged chunks do not form a fatal set. A fatal set of damaged chunks is a set that cannot be reconstructed without additional information. A fatal set for a conventional orthogonal code is a set of rows R and a set of columns C such that:

1) for every x in R, there are more than N1 damaged chunks at locations (x, y) where y is in C, and 2) for every y in C, there are more than N2 damaged chunks at locations (x, y) where x is in R.

The smallest fatal set is a set R of N2+1 rows and a set C of N1+1 columns, where every chunk at a location (x, y) (where x is in R and y is in C) is damaged.

In some implementations, metadata is used at the encoding system 102 or the data centers 104, 106, and 108 or both to keep track of data. For example, the metadata can specify which parts of a file are stored at which data centers, where redundant copies of data are stored, and the like.

Figure 2E:
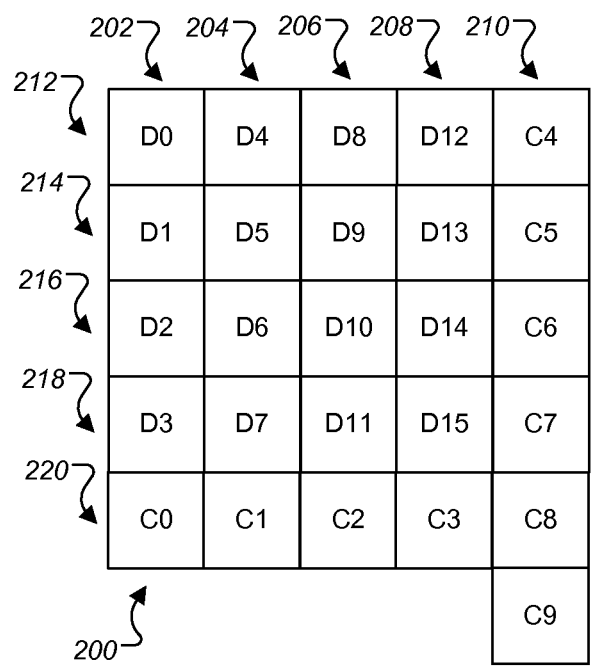
FIG. 2E is an illustration of the example block of data and code chunks from FIG. 2A with an additional corner code chunk.

FIG. 2A is an illustration of an example block 200 of data and code chunks. The block 200 is represented as a matrix of m×n chunks The example block 200 includes a block of four rows 212-218 and four columns 202-208 of data chunks, D0-D15. Error-correcting code chunks C0-C8 were added to the 4×4 block to create the example 5×5 block 200 as shown. C0-C3 are column code chunks and C4-C7 are row code chunks. C8 is a corner code chunk that can be either a row code chunk, a column code chunk, or both (as described further below with respect to FIG. 2E). In some implementations, the matrix is created from a block of data from a file (e.g. file 114) in column-major order, where successive data symbols are placed in successive rows of the same column until the last row is reached.

A data chunk is a specified amount of data. In some implementations, a data chunk is a contiguous portion of data from a file. In other implementations, a data chunk is one or more non-continuous portions of data from a file. For example, a data chunk can be 256 bytes or other units of data. In FIGS. 2A-B, data chunks are illustrated as squares and labeled with the letter "D" and a number. The number indicates the position of the data chunk in, e.g., a file.

An error-correcting code chunk includes a chunk of data based on one or more data chunks. In some implementations, each code chunk is the same specified size (e.g., 256 bytes) as the data chunks. The code chunks are generated using an error-correcting code, e.g., an MDS code. Examples of MDS codes include Reed-Solomon codes. Various techniques can be used to generate the code chunks. In general, any error-correcting code can be used that can reconstruct d data chunks from any set of d unique, healthy chunks (either data chunks or code chunks). Generating the code chunks for the block includes using an error-correcting code for chunks in each column and another error-correcting code for chunks in each row, and the same codes are used to generate the code chunks for each column.

Thus, for the first column 202 of the block 200, code chunk C0 is based on data chunks D0-D3. Because there is one code chunk and four data chunks, the entire column 202 and any chunk within the column 202 can be reconstructed as long as there are four healthy chunks (code chunks or data chunks) available from the column 202. Similarly, code chunk C1 is based on data chunks D4-D7, and so on.

Code chunks C4-C7 are based on the data chunks in their respective rows. For example, for the first row 212, C4 is based on D0, D4, D8, and D12. If any chunk within the row 212 is damaged, it can be reconstructed if the other four chunks are healthy. Code chunk C8 can be based on either the row code chunks in the last row 220 or the column code chunks in the last column 210. If the same codes are used to generate the code chunks for each row, then code chunk C8 will be the same regardless of whether it is determined using the row code chunks in the last row 220 or the column code chunks in the last column 210.

FIG. 2B illustrates an example scenario where multiple chunks of data from the block 200 are damaged.

A damaged chunk is a chunk containing one or more errors. Typically, a damaged chunk is identified using an error-detecting code. For example, a damaged chunk can be completely erased (e.g., if the chunk was stored in a hard drive destroyed in a hurricane), or a damaged chunk can have a single bit flipped. A healthy chunk is a chunk that is not damaged.

In the example shown in FIG. 2B, chunks D5, D7, D13, and D15 are damaged. If a conventional orthogonal code is used to generate the code chunks, this is an example of a fatal set; none of the damaged chunks can be reconstructed without additional information. Moreover, this is the smallest possible fatal set for the block 200. When N1=N2=1, as it does for the block 200 of FIGS. 2A and 2B, the smallest possible fatal set is four damaged chunks located in the corners of a rectangle.

The smallest possible fatal set is often the most likely fatal set to occur. Thus, it can be beneficial to adapt the orthogonal code so that the smallest possible fatal set is no longer fatal—so that the damaged chunks can be reconstructed. Techniques for adapting an orthogonal code so that the example shown in FIG. 2B does not result in a fatal set are set forth in further detail below.

FIG. 2C is an illustration of an example matrix 250 of row weights for generating row code chunks (e.g., C4-C7 in FIG. 2A). FIG. 2D is an illustration of an example matrix 260 of column weights for generating column code chunks (e.g., C0-C3 in FIG. 2A). Each matrix 250 and 260 has weights at each position in the matrix; however, for purposes of illustration, only weights [a b c d] are illustrated in FIG. 2C and weights [e f g h] are illustrated in FIG. 2D. Weights [a b c d] represent any four weights of a rectangle within the matrix 250 of row weights, so that a and b are in a same first row and c and d are in a same second row, and so that a and c are in a same first column and b and d are in a same second column. Weights [e f g h] represent the four weights of the matrix 260 of column weights at positions corresponding to positions of [a b c d] of the matrix 250 of row weights.

The matrices 250 and 260 conceptually illustrate row weights and column weights as used in conventional orthogonal codes and modified orthogonal codes. Consider a conventional orthogonal code that includes one linear MDS code for each row. The linear MDS code can be viewed as a row of row weights. To generate a row code chunk, each data chunk in a row is multiplied by its corresponding row weight—the row weight at its same position in the row. The results of the multiplications are then combined, e.g., by addition, to generate the row weight.

In a modified orthogonal code, different linear MDS codes are used for different rows, where the weights are selected as described further below. Each linear MDS code can be viewed as a row of row weights as described above for conventional orthogonal codes, but because different codes are used for different rows, the different codes can be viewed as forming the matrix 250 of row weights. For example, consider row code chunk C5. C5 can be generated by multiplying each data chunk in C5's row 214 by a row weight from the matrix 250 at its corresponding position, and then combining the results of the multiplications. So D5 would be multiplied by a, and D13 would be multiplied by b. D1 and D9 would be multiplied by the weights at their corresponding positions in the matrix 250, which are not illustrated.

If a=c, b=d, e=g, and f=h, then the set of damaged chunks illustrated in FIG. 2B results in a fatal set. The four equations relating the values of the four damaged chunks are not independent. However, if a different linear function is used to define the row weights of each row in the matrix 250 of row weights, and/or a different linear function is used to define the column weights of each column in the matrix 260 of column weights, then the values of [a b c d] and [e f g h] can be selected so that the four equations relating the values of the four damaged chunks are independent. Then the set of damaged chunks illustrated in FIG. 2B can be reconstructed.

For the four equations relating the values of the four damaged chunks to be independent, [a b c d] and [e f g h] are selected so that $$\frac{ad}{bc} \neq \frac{eh}{fg},$$

assuming that all the weights are nonzero. For example, if a parity code is used for the column weights, then e=f=g=h=1, and [a b c d] are selected so that ad≠bc. In another example, a parity code can be used for the row weights, and then a=b=c=d=1, and [e f g h] are selected so that eh≠fg. When the matrix 250 of row weights or the matrix 260 of column weights is selected to meet this condition, the matrix is said to be nonsingular.

Various techniques can be used to select [a b c d] and [e f g h] so that $$\frac{ad}{bc} \neq \frac{eh}{fg}.$$

For purposes of illustration, consider the following three example techniques. Each technique will be described as though a parity code is being used for the column weights so that [a b c d] are selected so that ad≠bc. However, the techniques can be used to select [e f g h] if a parity code is being used for the row weights, or even if neither the row weights nor the column weights forms a parity code.

In a first example, the weights selected for the row weights form a Cauchy matrix. Cauchy matrices are well known in the art and various methods can be used to select or generate a Cauchy matrix. Given two n-vectors x1, x2, . . . , xn and y1, y2, . . . , yn where all of the xi and yi are distinct, the corresponding Cauchy matrix is an n×n matrix C where each Cij=1/(xi−yj).

In a second example, the weights selected for the row weights form a matrix A where G=[I|A] is the generator matrix for an MDS code and I is the identity matrix. Any submatrix of A can also be used.

In a third example, the weights selected for the row weights are selected randomly (e.g., using a pseudo random number generator on a computer). Although selecting weights randomly does not guarantee that every [a b c d] will meet the above condition, the probability of each [a b c d] meeting the condition can be strong. In particular, the probability increases as the range of possible values for [a b c d] increases. In some implementations, selecting random weights includes selecting candidate weights, determining whether the candidate weights form a nonsingular matrix, and continuing to select different candidate weights until determining that the selected candidate weights form a nonsingular matrix.

FIG. 2E is an illustration of the example block 200 of data and code chunks from FIG. 2A with an additional corner code chunk C9.

Using an orthogonal code with a single linear MDS code for all rows and a single linear MDS code for all columns results in a set of code chunks that can act as both row code chunks and column code chunks. Those chunks can be generated based on either their respective rows or columns (either way results in the same value), and those chunks can be used for reconstruction of other chunks in either their respective rows or columns.

However, when different codes are used for different rows (or columns or both), those chunks can no longer act as both row code chunks and column code chunks. Instead, additional corner code chunks can be generated and stored. Consider the example shown in FIG. 2E where there is one row 220 of column code chunks and one column 210 of row code chunks. If C8 is a row code chunk based on C0-C3, then C9 can be a column code chunk based on C4-C8. Alternatively, C8 can be a column code chunk based on C4-C7 and C9 can be a row code chunk based on C0-C3 and C8. Adding an extra corner code chunk (e.g., C9) requires additional storage but increases the reliability of the stored data.

Figure 3:
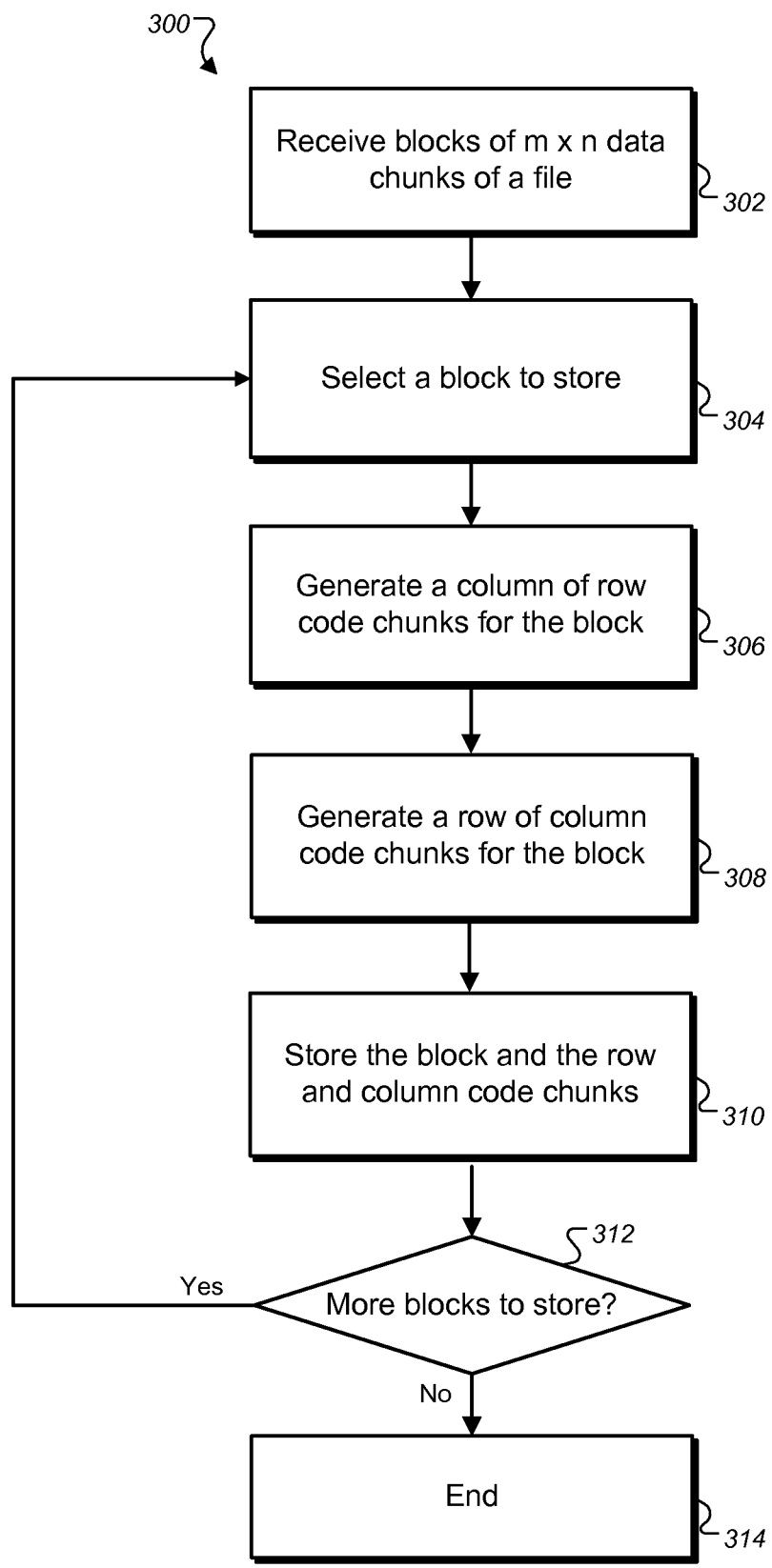
FIG. 3 is a flow diagram of an example process for storing a block of data using a modified orthogonal code.

FIG. 3 is a flow diagram of an example process 300 for storing a block of data using a modified orthogonal code. The process 300 can be performed by, for example, a system of one or more data processing apparatus (e.g., the encoding system 102 of FIG. 1). For purposes of illustration, the process 300 will be described with respect to a system that performs the process 300.

The system receives blocks of m×n data chunks of a file (step 302). In some implementations, the system receives a file or parts of the file with a request to store the corresponding data chunks. The system selects a block to store (304).

The system generates a column of error-correcting row code chunks using the block of data and a matrix of row weights, e.g., the matrix 250 illustrated in FIG. 2C (step 306). The matrix of row weights includes weights at every position of the matrix. The matrix includes weights [a b c d], wherein a and b are in a same first row and c and d are in a same second row.

The system generates a row of error-correcting column code chunks using the block of data and a matrix of column weights, e.g., the matrix 260 illustrated in FIG. 2D (step 308). The matrix of column weights includes weights at every position of the matrix. The matrix includes weights [e f g h] at positions corresponding to positions of [a b c d] in the matrix of row weights.

The matrix of row weights and the matrix of column weights are selected so that $$\frac{ad}{bc} \neq \frac{eh}{fg}$$

for at least one set of weights [a b c d] and [e f g h], and in some implementations, for every possible set of weights [a b c d] and [e f g h]. In some implementations, the system generates a corner code chunk using the column of row code chunks. For example, the system can generate a corner code chunk as illustrated in FIG. 2E. In those implementations, the corner code chunk can be viewed as being part of, or in addition to, the row of column code chunks. The row of column code chunks and the corner chunk, taken together, include a column code chunk for each column.

The system stores the block of data and the column of row code chunks and the row of column code chunks (step 310). For example, the encoding system 102 of FIG. 1 can store the data chunks and code chunks at one or more local storage nodes 114. In another example, the encoding system 102 of FIG. 1 can allocate each column to a distinct group of storage nodes, e.g., one of the data centers 104, 106, and 108 of FIG. 1. The encoding system 102 sends an allocated column to its allocated group of storage nodes. In that case, the encoding system 102 can generate the column of row code chunks, and each data center can generate a column code chunk for its allocated column based on the chunks in the column.

The system determines whether there are more blocks to store (step 312). For example, if there are more blocks in the file, the system stores those blocks by repeating steps 304-310. When the system stores all of the blocks of data, the process ends (step 314).

Figure 4:
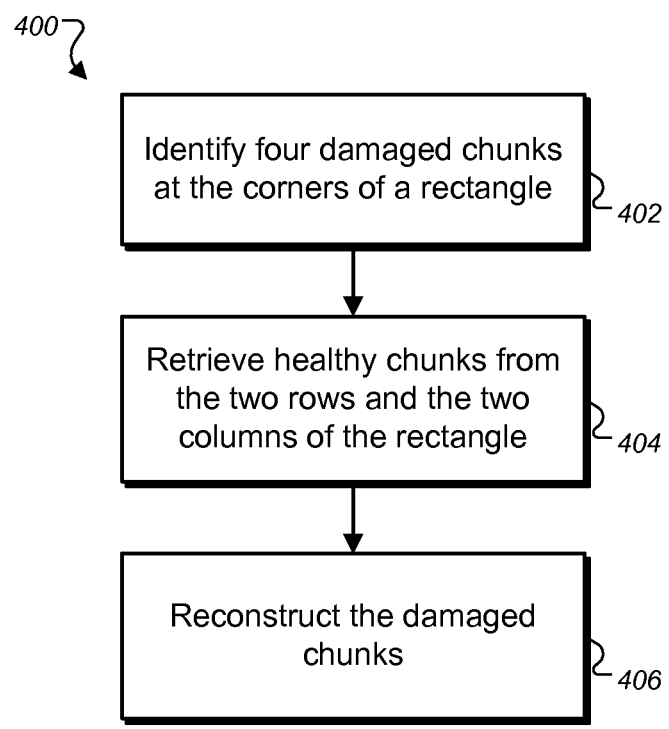
FIG. 4 is a flow diagram of an example process for reconstructing damaged chunks of data.

FIG. 4 is a flow diagram of an example process 400 for reconstructing damaged chunks of data stored, for example, using the process 300 described above with respect to FIG. 3. The process 400 can be performed by, for example, a system of one or more data processing apparatus (e.g., the encoding system 102 of FIG. 1). For purposes of illustration, the process 400 will be described with respect to a system that performs the process 400.

The process 400 illustrates reconstruction of a set of damaged chunks that would be a fatal set if the data was stored using an orthogonal code with a single linear MDS code for all rows and a single linear MDS code for all columns. Because the process 300 of FIG. 3, for example, was used to store the chunks, the system can reconstruct the chunks.

The system identifies four damaged chunks at the corners of a rectangle (step 402). Two of the chunks are in a same first row, and the other two chunks are in a same second row. Two of the chunks are in a same first column, and the other two chunks are in a same second column. For example, the system can identify four damaged chunks at positions corresponding to [a b c d] as described above with respect to FIG. 2B. The system determines that the chunks are damaged, for example, using an error-detecting code.

The system retrieves all the healthy chunks from the first and second rows and the first and second columns (step 404). For example, referring to the example scenario of FIG. 2B, the system can retrieve all the chunks from row 214 (D1, D9, and C5), row 218 (D3, D11, and C7), column 204 (D4, D6, and C1), and column 208 (D12, D14, and C3). If columns of data are stored at different groups of storage nodes, the system retrieves the chunks from those columns from the different groups of storage nodes.

The system reconstructs the damaged chunks (step 406). The system uses the retrieved healthy chunks and the weights of the code used to store the chunks to reconstruct the damaged chunks. More specifically, referring again to the example scenario of FIG. 2B, the values of damaged chunks D5, D7, D13, and D15 can be viewed as unknowns in the four equations used to generate code chunks C1, C3, C5, and C7. Those code chunks can be viewed as functions of those four unknowns, creating a set of four independent linear equations having four unknowns. The system can then use any of various techniques to solve the equations and reconstruct the damaged chunks. Because different codes were used for different rows, the system can reconstruct the damaged chunks, and the set of damaged chunks is not a fatal set.

Figure 5:
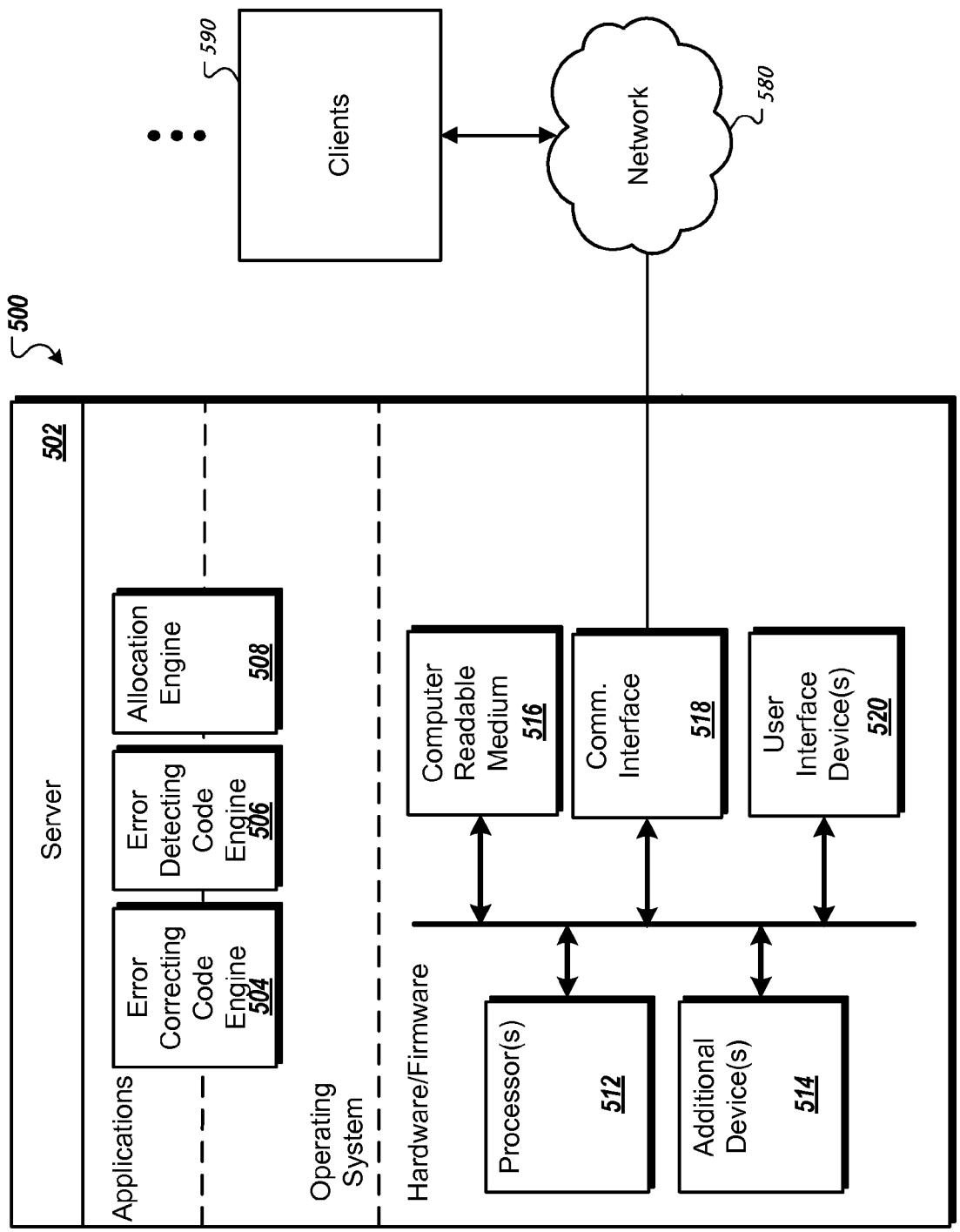
FIG. 5 is a schematic diagram of an example system configured for data storage, access, and maintenance.

FIG. 5 is a schematic diagram of an example system configured for data storage, access, and maintenance. The system generally consists of a server 502. The server 502 is optionally connected to one or more user or client computers 590 through a network 580. The server 502 consists of one or more data processing apparatus. While only one data processing apparatus is shown in FIG. 5, multiple data processing apparatus can be used. The server 502 includes various modules, e.g. executable software programs, including an error correcting code engine 504 for generating code chunks and reconstructing damaged chunks. An error detecting code engine 506 is configured to identify damaged chunks of data. An allocation engine 508 allocates code chunks and data chunks between one or more groups of storage nodes.

Each module runs as part of the operating system on the server 502, runs as an application on the server 502, or runs as part of the operating system and part of an application on the server 502, for instance. Although several software modules are illustrated, there may be fewer or more software modules. Moreover, the software modules can be distributed on one or more data processing apparatus connected by one or more networks or other suitable communication mediums.

The server 502 also includes hardware or firmware devices including one or more processors 512, one or more additional devices 514, a computer readable medium 516, a communication interface 518, and optionally one or more user interface devices 520. Each processor 512 is capable of processing instructions for execution within the server 502. In some implementations, the processor 512 is a single or multi-threaded processor. Each processor 512 is capable of processing instructions stored on the computer readable medium 516 or on a storage device such as one of the additional devices 514. The server 502 uses its communication interface 518 to communicate with one or more computers 590, for example, over a network 580.

In some implementations, the server 502 does not have any user interface devices. In other implementations, the server 502 includes one or more user interface devices. Examples of user interface devices 520 include a display, a camera, a speaker, a microphone, a tactile feedback device, a keyboard, and a mouse. The server 502 can store instructions that implement operations associated with the modules described above, for example, on the computer readable medium 516 or one or more additional devices 514, for example, one or more of a floppy disk device, a hard disk device, an optical disk device, or a tape device.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on computer storage medium for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., an HTML page) to a client device (e.g., for purposes of displaying data to and receiving user input from a user interacting with the client device). Data generated at the client device (e.g., a result of the user interaction) can be received from the client device at the server.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A method performed by data processing apparatus, the method comprising:
receiving a block of data comprising m rows and n columns of data chunks;
generating a column of error-correcting row code chunks including multiplying data chunks in the block of data by row weights in a matrix of row weights that includes weights [a b c d], wherein a and b are in a same first row and c and d are in a same second row, and wherein a and c are in a same first column and b and d are in a same second column;
generating a row of error-correcting column code chunks including multiplying data chunks in the block of data by column weights in a matrix of column weights that includes weights [e f g h] at positions corresponding to respective positions of [a b c d] in the matrix of row weights, wherein $$\frac{ad}{bc} \neq \frac{eh}{fg};$$

and
storing the block of data and the column of row code chunks and the row of column code chunks.

2. The method of claim 1, wherein:
e=f=g=h=1, and ad≠bc; or
a=b=c=d=1, and eh≠fg.

3. The method of claim 1, wherein the matrix of row weights or the matrix of column weights forms a Cauchy matrix.

4. The method of claim 1, wherein the matrix of row weights or the matrix of column weights forms a matrix A, wherein G=[I|A] and I is an identity matrix and G is a generator matrix for a maximum distance separable (MDS) code.

5. The method of claim 1, wherein at least one of the matrix of row weights or the matrix of column weights is assigned random weights.

6. The method of claim 5, wherein assigning the random weights comprises:
  determining whether the random candidate weights form a singular matrix; and
  continuing to generate different random candidate weights until determining random candidate weights that form a nonsingular matrix.

7. The method of claim 1, wherein:
  generating the column of error-correcting row code chunks includes generating a corner code chunk based on the row code chunks and an extra corner code chunk based on the column code chunks; or
  generating the row of error-correcting column code chunks includes generating a corner code chunk based on the column code chunks and an extra corner code chunk based on the row code chunks.

8. The method of claim 1, wherein storing the block of data and the column of row code chunks and the row of column code chunks comprises:
  for each column in the block of data and the column of row code chunks, storing each particular column and a corresponding column code chunk at a distinct group of storage nodes.

9. The method of claim 1, further comprising:
  identifying four damaged chunks at positions corresponding to the positions of [a b c d] and [e f g h];
  retrieving a plurality of healthy chunks from the first and second rows and the first and second columns; and
  reconstructing the four damaged chunks using [a b c d] and [e f g h] and the retrieved healthy chunks.

10. A system comprising one or more computers configured to perform operations comprising:
  receiving a block of data comprising m rows and n columns of data chunks;
  generating a column of error-correcting row code chunks including multiplying data chunks in the block of data by row weights in a matrix of row weights that includes weights [a b c d], wherein a and b are in a same first row and c and d are in a same second row, and wherein a and c are in a same first column and b and d are in a same second column;
  generating a row of error-correcting column code chunks including multiplying data chunks in the block of data by column weights in a matrix of column weights that includes weights [e f g h] at positions corresponding to respective positions of [a b c d] in the matrix of row weights, wherein $$\frac{ad}{bc} \neq \frac{eh}{fg};$$

and
  storing the block of data and the column of row code chunks and the row of column code chunks.

11. The system of claim 10, wherein:
  e=f=g=h=1, and ad≠bc; or
  a=b=c=d=1, and eh≠fg.

12. The system of claim 10, wherein the matrix of row weights or the matrix of column weights forms a Cauchy matrix.

13. The system of claim 10, wherein the matrix of row weights or the matrix of column weights forms a matrix A, wherein G=[I|A] and I is an identity matrix and G is a generator matrix for a maximum distance separable (MDS) code.

14. The system of claim 10, wherein at least one of the matrix of row weights or the matrix of column weights is assigned random weights.

15. The system of claim 14, wherein assigning the random weights comprises:
  generating random candidate weights;
  determining whether the random candidate weights form a singular matrix; and
  continuing to generate different random candidate weights until determining random candidate weights that form a nonsingular matrix.

16. The system of claim 10, wherein:
  generating the column of error-correcting row code chunks includes generating a corner code chunk based on the row code chunks and an extra corner code chunk based on the column code chunks; or
  generating the row of error-correcting column code chunks includes generating a corner code chunk based on the column code chunks and an extra corner code chunk based on the row code chunks.

17. The system of claim 10, wherein storing the block of data and the column of row code chunks and the row of column code chunks comprises:
  for each column in the block of data and the column of row code chunks, storing each particular column and a corresponding column code chunk at a distinct group of storage nodes.

18. The system of claim 10, the operations further comprising:
  identifying four damaged chunks at positions corresponding to the positions of [a b c d] and [e f g h];
  retrieving a plurality of healthy chunks from the first and second rows and the first and second columns; and
  reconstructing the four damaged chunks using [a b c d] and [e f g h] and the retrieved healthy chunks.

19. A non-transitory computer storage medium encoded with a computer program, the program comprising instructions that when executed by one or more computers cause the one or more computers to perform operations comprising:
  receiving a block of data comprising m rows and n columns of data chunks;
  generating a column of error-correcting row code chunks including multiplying data chunks in the block of data by row weights in a matrix of row weights that includes weights [a b c d], wherein a and b are in a same first row and c and d are in a same second row, and wherein a and c are in a same first column and b and d are in a same second column;
  generating a row of error-correcting column code chunks including multiplying data chunks in the block of data by column weights in a matrix of column weights that includes weights [e f g h] at positions corresponding to respective positions of [a b c d] in the matrix of row weights, wherein $$\frac{ad}{bc} \neq \frac{eh}{fg};$$

and
  storing the block of data and the column of row code chunks and the row of column code chunks.

20. The computer storage medium of claim 19, wherein:
e=f=g=h=1, and ad≠bc; or
a=b=c=d=1, and eh≠fg.

21. The computer storage medium of claim 19, wherein the matrix of row weights or the matrix of column weights forms a Cauchy matrix.

22. The computer storage medium of claim 19, wherein the matrix of row weights or the matrix of column weights forms a matrix A, wherein G=[I|A] and I is an identity matrix and G is a generator matrix for a maximum distance separable (MDS) code.

23. The computer storage medium of claim 19, wherein at least one of the matrix of row weights or the matrix of column weights is assigned random weights.

24. The computer storage medium of claim 23, wherein assigning the random weights comprises:
generating random candidate weights;
determining whether the random candidate weights form a singular matrix; and
continuing to generate different random candidate weights until determining random candidate weights that form a nonsingular matrix.

25. The computer storage medium of claim 19, wherein:
generating the column of error-correcting row code chunks includes generating a corner code chunk based on the row code chunks and an extra corner code chunk based on the column code chunks; or
generating the row of error-correcting column code chunks includes generating a corner code chunk based on the column code chunks and an extra corner code chunk based on the row code chunks.

26. The computer storage medium of claim 19, wherein storing the block of data and the column of row code chunks and the row of column code chunks comprises:
for each column in the block of data and the column of row code chunks, storing each particular column and a corresponding column code chunk at a distinct group of storage nodes.

27. The computer storage medium of claim 19, the operations further comprising:
identifying four damaged chunks at positions corresponding to the positions of [a b c d] and [e f g h];
retrieving a plurality of healthy chunks from the first and second rows and the first and second columns; and
reconstructing the four damaged chunks using [a b c d] and [e f g h] and the retrieved healthy chunks.

* * * * *

UNITED STATES PATENT AND TRADEMARK OFFICE
CERTIFICATE OF CORRECTION

| | |
|---|---|
| PATENT NO. | : 8,621,317 B1 |
| APPLICATION NO. | : 13/190151 |
| DATED | : December 31, 2013 |
| INVENTOR(S) | : Robert Cypher |

It is certified that error appears in the above-identified patent and that said Letters Patent is hereby corrected as shown below:

In the Claims

Column 13, Line 8, Claim 6, before "determining" insert --generating random candidate weights;--.

Signed and Sealed this
Twenty-first Day of October, 2014

Michelle K. Lee
*Deputy Director of the United States Patent and Trademark Office*